United States Patent
Kawamura

[11] Patent Number: 5,939,923
[45] Date of Patent: Aug. 17, 1999

[54] SELECTABLE LOW POWER SIGNAL LINE AND METHOD OF OPERATION

[75] Inventor: J. Patrick Kawamura, Richardson, Tex.

[73] Assignee: Texas Instruments Incorporated, Dallas, Tex.

[21] Appl. No.: 08/971,809

[22] Filed: Nov. 17, 1997

[51] Int. Cl.$^6$ .................................................. H03K 5/00
[52] U.S. Cl. ........................................ 327/333; 327/437
[58] Field of Search .................................. 327/333, 170, 327/108, 545, 546; 326/80, 81, 17

[56] References Cited

U.S. PATENT DOCUMENTS

| | | | |
|---|---|---|---|
| 5,436,585 | 7/1995 | Dimarco | 327/333 |
| 5,450,356 | 9/1995 | Miller | 365/189.5 |
| 5,614,859 | 3/1997 | Ong | 327/333 |
| 5,712,586 | 1/1998 | Kitao | 327/333 |
| 5,793,225 | 8/1998 | Gerson | 326/68 |

Primary Examiner—Timothy P. Callahan
Assistant Examiner—Maria Hasanzadah
Attorney, Agent, or Firm—Robby T. Holland; Carlton H. Hoel; Richard L. Donaldson

[57] ABSTRACT

A selectable low power signal line (10) is provided that includes a driver circuit (12) connected to receive an input signal for transmission and to receive a mode select signal (SELECT). The driver circuit (12) has a low power mode and a full power mode selectable responsive to the mode select signal (SELECT). The driver circuit (12) is operable, when in the full power mode, to drive an output signal at a full swing of the input signal. When in the low power mode, the driver circuit (12) is operable to drive the output signal at a fraction of the full swing of the input signal. A physical signal line (14) is connected to receive the output signal of the driver circuit (12) and to carry the output signal. A receiver circuit (16) is connected to receive the signal on the physical signal line (14) and is also connected to receive the mode select signal (SELECT). The receiver circuit (16) has a low power and full power mode selectable responsive to the mode select signal (SELECT). The receiver circuit (16) is operable, when in the full power mode, to drive an output signal at a full swing of the signal on the physical signal line (14). When in the low power mode, the receiver circuit (16) is operable to convert the signal on the physical signal line (14) from a fraction of the full swing of the input signal to a full swing of the input signal and to drive the output signal at the full swing.

21 Claims, 3 Drawing Sheets

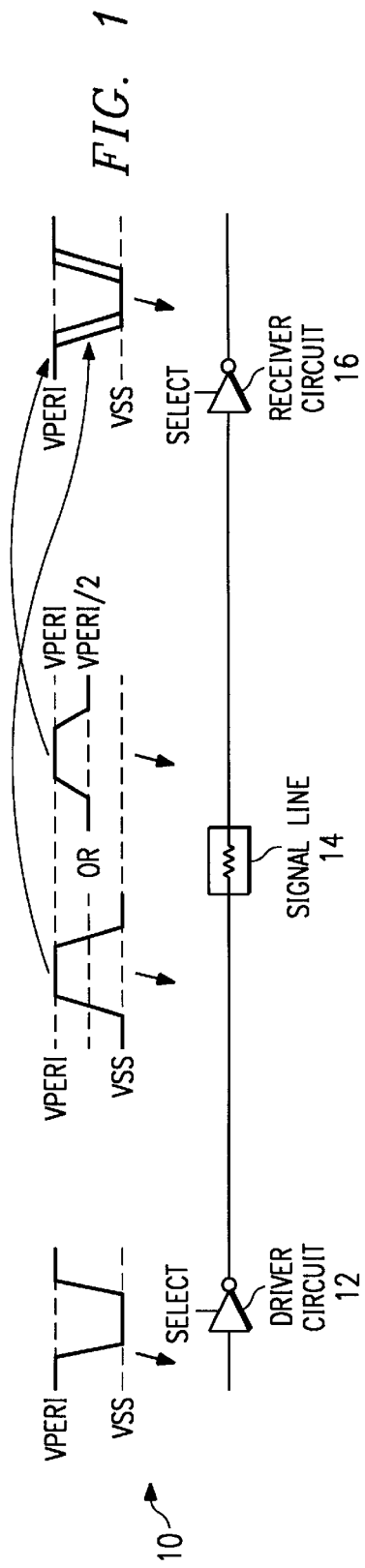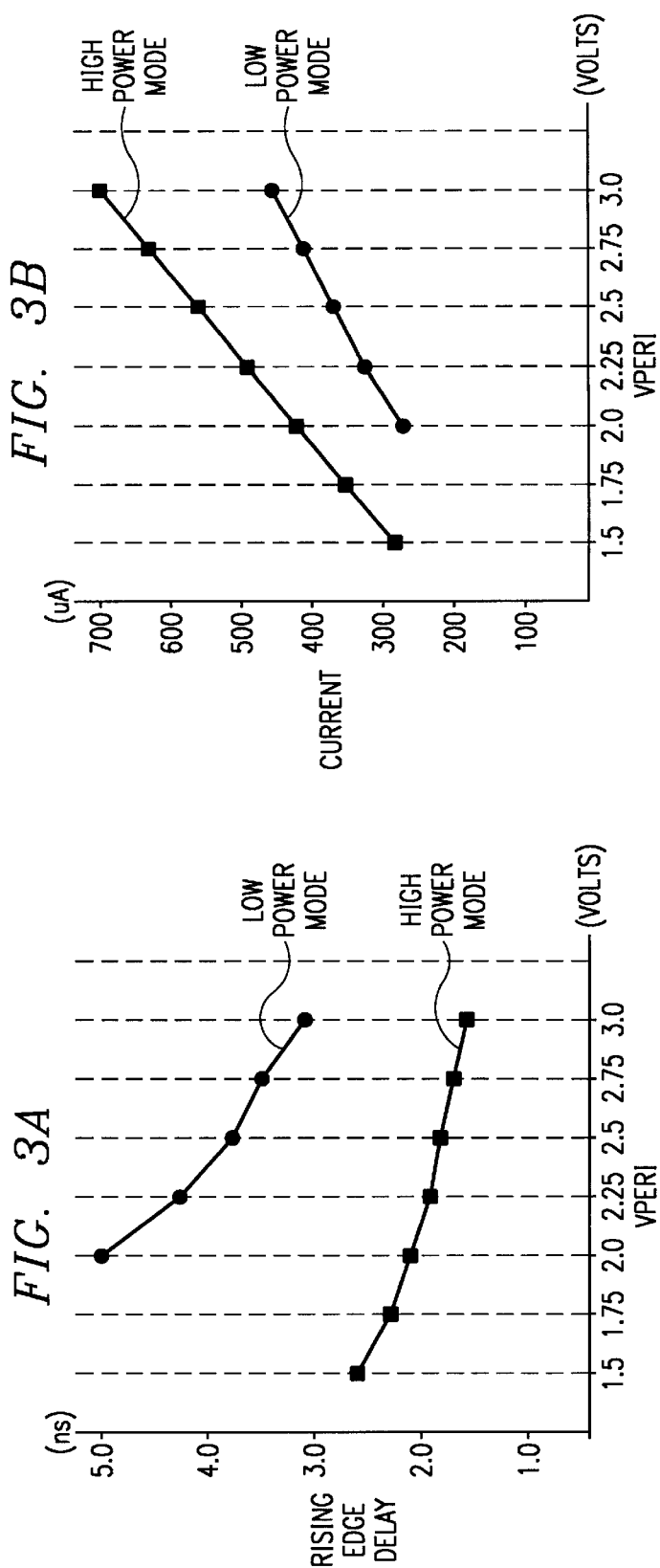

SELECTABLE LOW POWER SIGNAL LINE AND METHOD OF OPERATION

TECHNICAL FIELD OF THE INVENTION

This invention relates in general to the field of electronic systems, and more particularly to a selectable low power signal line and a method of operation.

BACKGROUND OF THE INVENTION

A need for low power integrated circuits, in part, has been driven by a concern for device reliability at high operating frequency and thin gate oxide as well as a desire to significantly improve battery life for portable applications. The lowering of the integrated circuit supply voltage levels has been an important vehicle for power reduction along with reductions in chip size. However, a need for higher functional integration on chips, such as adding both read/write cache memory and memory controllers on microprocessor units (MPUs), results in larger chips with large on-chip signal lines for data and logic. This trend towards integration limits the power savings realized through high local device packing density and lower supply voltages.

An increasing number and size of signal lines results in higher device power consumption from the charging and discharging of the signal lines. The amount of current required to charge a signal line from logic low to logic high is proportional to the capacitance of the line and the voltage between the high and low logic levels. An increase in the physical dimensions of the signal line results in a larger line capacitance and higher power consumption. With more and longer signal lines being used, the problem of signal line power consumption becomes apparent.

SUMMARY OF THE INVENTION

In accordance with the present invention, a selectable low power signal line and a method of operation are provided that substantially reduce or eliminate disadvantages and problems associated with previously developed signal lines.

According to one embodiment of the present invention, a selectable low power signal line is provided that includes a driver circuit, a physical signal line and a receiver circuit. The driver circuit is connected to receive a full swing input signal for transmission and to receive a mode select signal. The driver circuit has a low power mode and a full power mode selectable responsive to the mode select signal. The driver circuit operable, when in the full power mode, to drive an output signal at a full swing of the input signal. When in the low power mode, the driver circuit is operable to drive the output signal at a fraction of the full swing of the input signal. The physical signal line is connected to receive the output signal of the driver circuit and to carry the output signal. The receiver circuit is then connected to receive the signal on the physical signal line and is also connected to receive the mode select signal. The receiver circuit has a low power and full power mode selectable responsive to the mode select signal. The receiver circuit is operable, when in the full power mode, to drive an output signal at a full swing of the signal on the physical signal line. When in the low power mode, the receiver circuit is operable to convert the signal on the physical signal line from a fraction of the full swing of the input signal to a full swing of the input signal and to drive the output signal at the full swing.

A technical advantage of the present invention is the provision of a switchable low power signal line that allows the signal line to be run with the bus voltage swing at a fraction of the normal internal supply voltage level as well as at the full internal supply voltage swing. The selection between modes is accomplished by asserting a control signal. The present invention produces a reduction in power between the low power and full power modes to allow conservation of power when feasible.

BRIEF DESCRIPTION OF THE DRAWINGS

A more complete understanding of the present invention and advantages thereof may be acquired by referring to the following description taken in conjunction with the accompanying drawings in which like reference numbers indicate like features, and wherein:

FIG. 1 is a block diagram of one embodiment of a selectable low power signal line constructed according to the teachings of the present invention;

FIGS. 3A and 3B show charts comparing low power and full power modes of the selectable low power signal line of FIG. 2.

DETAILED DESCRIPTION OF THE INVENTION

Figure 2:
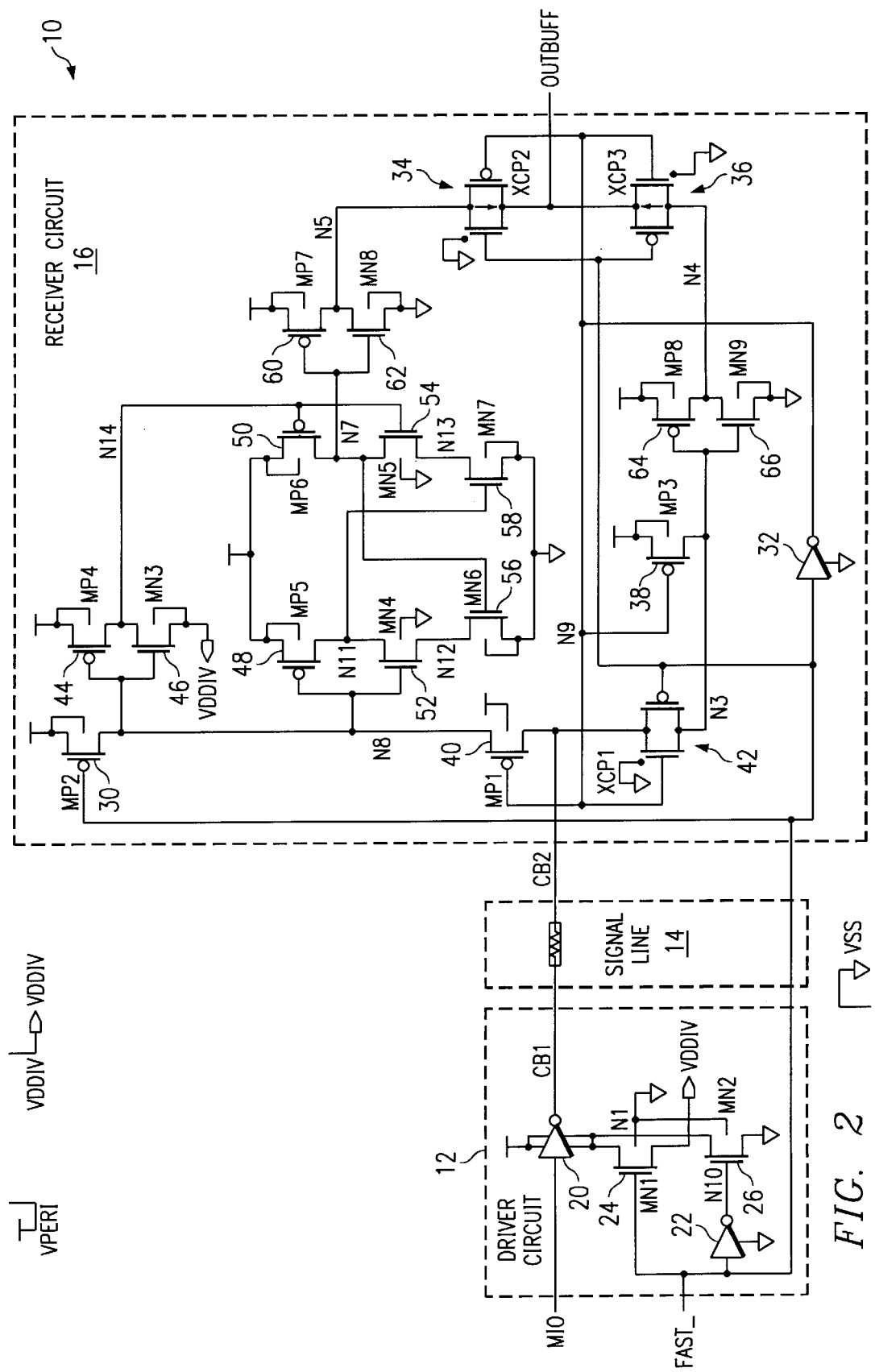
FIG. 2 is a circuit diagram of one embodiment of the selectable low power signal line of FIG. 1.

FIG. 1 is a block diagram of one embodiment of a selectable low power signal line, indicated generally at 10, constructed according to the teachings of the present invention. Signal line 10 includes a driver circuit 12 which provides a signal to a physical signal line 14. Physical line 14 then feeds a receiver circuit 16 and can be a data line, logic signal or other line in an integrated circuit or on a printed circuit board. Both driver circuit 12 and receiver circuit 16 receive a mode selection signal, SELECT, which determines whether signal line 10 is operated in the low power mode or the full power mode. In the illustrated embodiment, driver circuit 12 receives a signal which has a voltage swing from a positive voltage supply, $V_{PERI}$, to ground potential, $V_{SS}$, between logic high and logic low. According to the present invention, the output of driver circuit 12 is an inverted signal which either has a full swing or fractional swing depending upon which mode is selected. The embodiments shown in the FIGUREs and described herein show the fractional swing as a half-swing signal between the positive power supply and half that voltage. It should be understood, however, that the fractional swing could take other forms.

In the embodiment of FIG. 1, in the full power, full swing mode, the output of driver circuit 12 and the signal on physical line 14 swings from $V_{SS}$ to $V_{PERI}$ as did the input to driver circuit 12. In the low power, half-swing mode, the output of driver circuit 12 and the signal on physical line 14 swings between, for example, the positive voltage supply, $V_{PERI}$, and one-half that voltage, $$\frac{V_{PERI}}{2}.$$

It should be understood, that the half swing during low power mode could also be between ground potential, $V_{SS}$, and or between other reduced swing voltage levels.

Receiver circuit 16 receives the signal on physical line 14 and provides an output. During the full power, full swing mode, receiver circuit 16 operates to invert the signal on physical line 14 such that the output signal has the same shape as the original input to driver circuit 12. As shown, in full power mode, the output of receiver circuit 16 swings between $V_{SS}$ and $V_{PERI}$. In low power, half-swing mode, receiver circuit 16 receives the one-half swing signal on physical line 14 and converts that signal to a full swing output. In this case, the output of receiver circuit 16 is slightly delayed with respect to the output in full power mode. This delay is due to the circuit operation of converting the half swing signal to a full swing signal.

The present invention provides a selectable low power signal line which can operate at full power or low power based upon a select signal. The selectable low power signal line is comprised of the three basic elements of driver circuit 12, physical line 14 and receiver circuit 16. In one embodiment, the present invention uses an intermediate supply generator, such as $$\frac{V_{PERI}}{2}$$

generator, to provide a lower limit for the swing of the routed signal during low power mode. This type of one-half power supply generator is commonly found on DRAM-type integrated circuit devices and other integrated circuit devices. For example, one-half power supply generators are often used on DRAM-type devices for supplying a bitline reference and storage node plate bias.

FIG. 2 is a circuit diagram of one embodiment of the selectable low power signal line 10 of FIG. 1. FIG. 2 provides a circuit implementation of driver circuit 12 and receiver circuit 16. The physical signal line 14 is a long signal line which has a relatively large time constant, RC. The embodiment of FIG. 2 is for a main input/output (MIO) signal within an integrated circuit memory device, thus driver circuit 12 receives a MIO signal, as shown. Driver circuit 12 and receiver circuit 16 receive a mode select signal,

FAST, which determines whether or not signal line 10 is operating in the low power mode or the full power mode.

Driver circuit 12 includes a first inverter 20 and a second inverter 22. Driver circuit 12 also includes N channel transistors 24 and 26. The full power, full swing mode is selected by setting the mode select signal,

FAST, to a logic low which turns off N channel transistor 24 and turns on N channel transistor 26. In this mode, inverter 20 has its lower power supply connected to ground potential through N channel transistor 26. Driver circuit 12 thereby produces a full swing output signal from inverter 20. Conversely, when the mode select signal,

FAST, is set high to select low power mode, N channel transistor 24 is turned on and N channel transistor 26 is turned off. In this case, the lower power supply of inverter 20 is connected to the voltage supply, $V_{DDIV}$, which is one-half of the positive voltage supply, $V_{PERI}$. With this connection, inverter 20 produces an output signal which is a half swing signal between $V_{PERI}$ and $V_{DDIV}$. The signal provided by driver circuit 12 is transported across physical line 14 and received by receiver circuit 16. In order for the present invention to be particularly beneficial, the physical line 14 should have a relatively large time constant RC and require a relatively large amount of current to charge.

Receiver circuit 16 receives the signal from physical line 14 and receives the mode select signal,

FAST.

Receiver circuit 16 includes a P channel transistor 30, an inverter 32, a CMOS pass gate 34 and a CMOS pass gate 36, which all receive the mode select signal,

FAST.

The output of inverter 32 is the logical inversion of the mode select signal,

FAST.

This inverted signal is provided to CMOS pass gate 34, CMOS pass gate 36, P channel transistor 38, P channel transistor 40 and CMOS pass gate 42. CMOS pass gate 42 also receives the non-inverted mode select signal,

FAST, as shown. The mode select signal,

FAST, therefore controls these devices to turn off or turn on the devices depending on which operation mode is selected. Receiver circuit 16 further includes a P channel transistor 44 and N channel transistor 46 which operate as a buffer to a level shifter circuit formed by P channel transistors 48 and 50 and N channel transistors 52, 54, 56 and 58. The level shifter circuit operates to convert the received signal from a half swing to a full swing voltage signal, which is then provided to the buffer formed by P channel transistor 60 and N channel transistor 62 and to CMOS pass gate 34. P channel transistor 64 and N channel transistor 66 form an output buffer for providing a signal to CMOS pass gate 36.

When the mode select signal,

FAST, is low indicating full power mode, the lower half of receiver circuit 16 is activated. The signal on physical line 14 therefore passes through CMOS pass gate 42, through the buffer formed by transistor 64 and transistor 66, through CMOS pass gate 36 and to the output node, OUTBUFF. On the other hand, when the mode select signal,

FAST, is high indicating low power mode, the upper portion of receiver circuit 16 is activated. In this case, the signal on physical line 14 is passed up through P channel transistor 40 and is fed to the level shifter circuit which converts the signal from half swing to full swing. The full swing signal is then provided to buffer formed by transistors 60 and 62, through CMOS pass gate 34 and to the output node, OUTBUFF. Due to the operation of the level shifter circuit, the output signal produced in low power mode is slightly delayed with respect to the output signal that is produced in full power mode.

In general, driver circuit 12 operates to invert the data state on the MIO line and drives physical line 14 with the inverted signal. Due to the relative high capacitance and resistance of physical line 14, driver circuit 12 has inverter 20 which is a wide channel transistor. To achieve a driver capability of driving physical line 14 between $V_{PERI}$ and $V_{SS}$, or between $V_{PERI}$ and $V_{DDIV}$ (i.e., $$\left(\text{i.e., } \frac{V_{PERI}}{2}\right),$$

the source and bulk of the N channel device in inverter 20 can be tied either to $V_{SS}$, or $V_{DDIV}$, depending on the state of the mode select signal,

FAST.

In the embodiment of FIG. 2, when the mode select signal,

FAST, is high, the signal swing voltage is between $V_{PERI}$ and $V_{DDIV}$, and signal line 10 is in low power mode with a slower operating speed. Conversely, when the mode select signal,

FAST, is low, the signal swing is $V_{PERI}$ to $V_{SS}$, and signal line 10 is in full power mode with a higher operating speed.

Receiver circuit 16 takes the signal propagating through the relatively high RC physical line 14 and inverts the signal, for example, to improve the shape of the signal. When signal line 10 is in the full power mode, receiver circuit 16 routes the signal through pass gate 42, and it gets inverted by transistors 64 and 66, and the signal passes through pass gate 36 to drive the output buffer. If signal line 10 is in the low power mode, the signal is passed though pass gate transistor 40 and works its way to the level shifter formed by transistors 44, 46, 48, 50, 52, 54, 56 and 58. The level shifter then converts the output to a full $V_{PERI}$ to $V_{SS}$ swing that can be inverted by transistors 60 and 62 to drive the output buffer through pass gate 34. Receiver circuit 16 includes pull up transistor 30 and transistor 38 to pre-charge node N8 or N3, respectively, if the pass gate transistor 40 or pass gate 42 are turned off.

FIGS. 3A and 3B shows charts comparing low power and full power modes for selectable low power signal line 10 of FIG. 2 based upon circuit simulation software used to obtain first order speed and power consumption estimates. FIGS. 3A and 3B reflect simulations that were performed to check the sensitivity of the rising edge delay and power consumption on the operating voltage, $V_{PERI}$. The rising edge delay is charted versus the voltage supply $V_{PERI}$ for both low power and full power modes. Also, as shown in FIG. 3B, the current used by the driver circuit and receiver circuit are plotted versus the voltage supply $V_{PERI}$. As can be seen, the low power mode uses significantly less current than the full power mode which provides its low power nature. However, also as can be seen in FIG. 3A, the rising edge delay with respect to the input signal is larger in the low power mode than in full power mode.

Figure 4A:
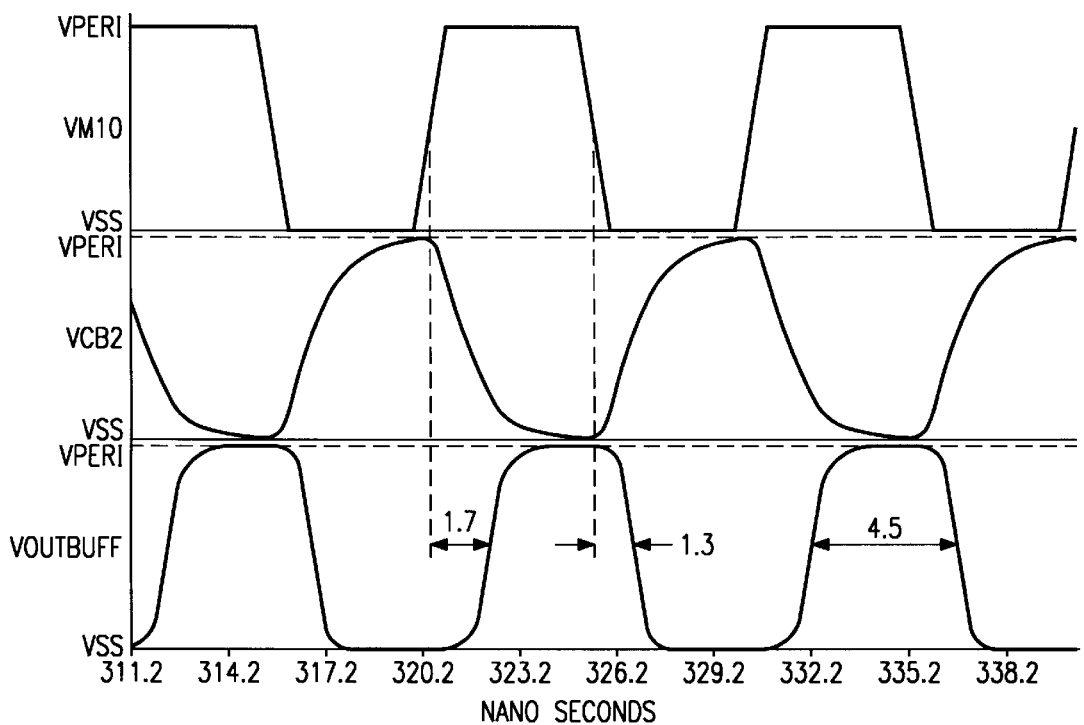
FIGS. 4A and 4B are timing diagrams of signals within the selectable low power signal line of FIG. 2 during full power and low power operating modes
Figure 4B:
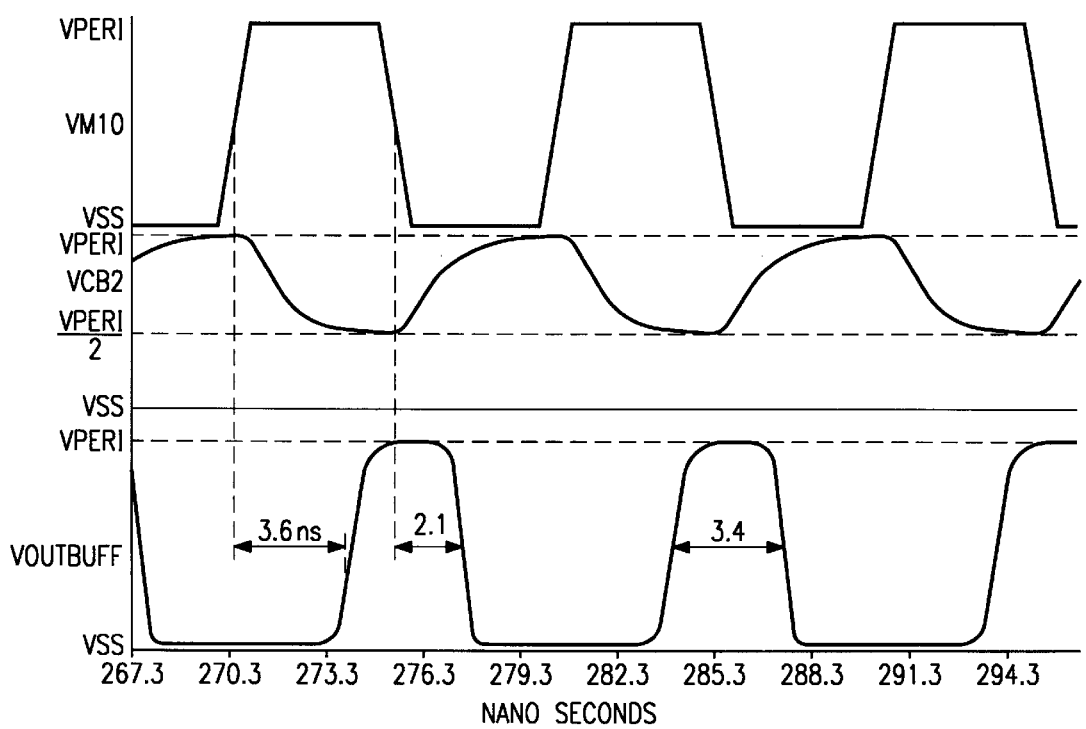

FIGS. 4A and 4B are timing diagrams of signals within the selectable low power signal line 10 of FIG. 2 during high and low power operating modes. As shown, the voltage level on the input line, $V_{MIO}$, varies from the voltage supply, $V_{PERI}$ to ground potential $V_{SS}$. The voltage level input to the receiver circuit, $V_{CB2}$, is shown along with the receiver circuit output voltage, $V_{OUTBUFF}$. FIG. 4A shows these signals when the selectable low power signal line is operating in full power mode. As can be seen, the input to the receiver circuit, $V_{CB2}$, is a full swing signal, and the voltage level of the output of the receiver circuit, $V_{OUTBUFF}$, is delayed from the rising and falling edges of the input signal, $V_{MIO}$. FIG. 4B then shows the same signals for the selectable low power signal line operating in low power mode. As can be seen, the voltage level of the signal input to the receiver circuit, $V_{CB2}$, is a half-swing voltage level. The receiver circuit output signal, $V_{OUTBUFF}$, is delayed from the original input signal and the delay is greater than that for FIG. 4A.

The present invention provides significant advantages where signal line power consumption needs to be reduced and where the speed of operation of the signal line can be sacrificed to obtain this reduction in power consumption. For example, the present invention will provide significant advantages to personal computers and integrated circuits needing to have a sleep mode in which activity is minimized by slowing bus speeds. During such periods of time, it also makes sense to provide selectable low power modes for the various signal lines within the system. Further, integrated circuit memory devices often have low power self refresh, and the present invention provides advantages to power consumption by operating the various control and data signals on the device at reduced swing during these refresh modes. It should be understood that the present invention would provide other significant advantages depending upon the implementation.

The growth in integrated circuit die area and the widespread use of parallel and pipeline architectures and increased integration will continue to drive up the number and size of signal and data lines on a chip. The signal line charging current component will become a significant factor in total device current consumption. As a consequence, the selectable low power scheme using a half swing driver circuit and full swing restore level shifter according to the present invention provides advantages by reducing signal line charging current for low power operations.

Although the present invention has been described in detail, it should be understood that various changes, substitutions and alterations can be made thereto without departing from the spirit and scope of the invention as defined by the appended claims.

What is claimed is:

1. A selectable low power signal line, comprising:

a driver circuit connected to receive an input signal for transmission and to receive a mode select signal, the driver circuit having a low power mode and a full power mode selectable responsive to the mode select signal, the driver circuit operable:

when in the full power mode, to drive an output signal at a full swing of the input signal; and when in the low power mode, to drive the output signal at a fraction of the full swing of the input signal;

a physical signal line connected to receive the output signal of the driver circuit and to carry the output signal; and a receiver circuit connected to receive the signal on the physical signal line and to receive the mode select signal, the receiver circuit having a low power and full power mode selectable responsive to the mode select signal, the receiver circuit operable:

when in the full power mode, to drive an output signal at a full swing of the signal-on the physical signal line; and when in the low power mode, to convert the signal on the physical signal line from a fraction of the full swing of the input signal to a full swing of the input signal and to drive the output signal at the full swing.

2. The selectable low power signal line of claim 1, wherein the full swing of the input signal is between a positive voltage supply and ground potential.

3. The selectable low power signal line of claim 2, wherein the fraction of the full swing of the input signal is between the positive voltage supply and one- half of the positive voltage supply.

4. The selectable low power signal line of claim 2, wherein the driver circuit, physical signal line and receiver circuit are part of an integrated circuit.

5. The selectable low power signal line of claim 4, wherein the positive voltage supply is $V_{PERI}$ within an integrated circuit memory device.

6. The selectable low power signal line of claim 5, wherein the fraction of the full swing of the input signal is between $V_{PERI}$ and $$\frac{V_{PERI}}{2}.$$

7. A selectable low power signal line, comprising:

a driver circuit connected to receive an input signal for transmission and to receive a mode select signal, the driver circuit comprising an inverter that receives the input signal and has a selectable low voltage supply responsive to the mode select signal, where the low voltage supply of the inverter:

when a full power mode is selected, is connected to ground potential and the inverter drives an output signal at a full swing of the input signal; and when a low power mode is selected, is connected to a voltage supply that is higher than ground potential and the inverter drives the output signal at a fraction of the full swing of the input signal;

a physical signal line connected to receive the output signal of the driver circuit and to carry the output signal; and a receiver circuit connected to receive the signal on the physical signal line and to receive the mode select signal, the receiver circuit comprising a low power signal path and a full power signal path selectable responsive to the mode select signal, the receiver circuit operable:

when in the full power mode, to direct the signal on the physical signal line through the full power signal path and drive an output signal at a full swing of the signal on the physical signal line; and when in the low power mode, to direct the signal on the physical signal line through the low power signal path to convert the signal on the physical signal line from a fraction of the full swing of the input signal to a full swing of the input signal and to drive the output signal at the full swing.

8. The selectable low power signal line of claim 7, wherein the voltage supply that is higher than ground potential is one-half of the positive voltage supply.

9. The selectable low power signal line of claim 7, wherein the low voltage supply of the inverter in the driver circuit is connected to the inverter using MOS transistor devices.

10. The selectable low power signal line of claim 7, wherein the low power path of the driver circuit comprises a level shifter circuit.

11. The selectable low power signal line of claim 7, wherein the driver circuit, physical signal line and receiver circuit are part of an integrated circuit.

12. The selectable low power signal line of claim 11, wherein the positive voltage supply is $V_{PERI}$ within an integrated circuit memory device.

13. The selectable low power signal line of claim 12, wherein the fraction of the full swing of the input signal is between $V_{PERI}$ and $$\frac{V_{PERI}}{2}.$$

14. A method of operation for a selectable low power signal line, comprising:

controlling a mode select signal provided to a driver circuit and a receiver circuit interconnected by a physical signal line;

selecting a full power mode using-the mode select signal when full power operation is desired:

the driver circuit responding to the selection of the full power mode by driving a signal on the physical signal line that is a full swing of an input signal;

selecting a low power mode using the mode select signal when low power operation is desired:

the driver circuit responding to the selection of the low power mode by driving a signal on the physical signal line that is a fraction of a full swing of an input signal; and the receiver circuit responding to the selection of the low power mode by converting the signal back to full swing.

15. The method of claim 14, wherein the full swing of the input signal is between a positive voltage supply and ground potential.

16. The method of claim 15, wherein the fraction of the full swing of the input signal is between the positive voltage supply and one-half of the positive voltage supply.

17. The method of claim 15, wherein the fraction of the full swing of the input signal is between the one-half of the positive voltage supply and ground potential.

18. The method of claim 15, wherein the driver circuit, physical signal line and receiver circuit are part of an integrated circuit.

19. The method of claim 17, wherein the positive voltage supply is $V_{PERI}$ within an integrated circuit memory device.

20. The method of claim 18, wherein the fraction of the full swing of the input signal is between $V_{PERI}$ and $$\frac{V_{PERI}}{2}.$$

21. The method of claim 18, wherein the fraction of the full swing of the input signal is between $$\frac{V_{PERI}}{2}$$

and $V_{SS}$.

* * * * *

UNITED STATES PATENT AND TRADEMARK OFFICE
CERTIFICATE OF CORRECTION

PATENT NO. : 5,939,923
DATED : Dec. 17, 1999
INVENTOR(S) : J Patrick Kawamura

It is certified that error appears in the above-identified patent and that said Letters Patent is hereby corrected as shown below:

Title page, insert the following item:

--[60] Provisional Application No: 60/[035,374] filed Dec. 27, 1995.--.

Column 1, line 4, insert the following:

--Cross Reference to Related Application Reference is made to and priority claimed from U.S. Provisional Application Ser. No. 60/[035,374] Dec. 27, 1995--.

Signed and Sealed this

Fifth Day of September, 2000

*Attest:*

Q. TODD DICKINSON

*Attesting Officer*   *Director of Patents and Trademarks*